(12) United States Patent
Hsu et al.

(10) Patent No.: US 7,638,072 B2
(45) Date of Patent: Dec. 29, 2009

(54) ELECTRICALLY CONDUCTIVE POLYMER COMPOSITIONS

(75) Inventors: Che-Hsiung Hsu, Wilmington, DE (US); Ian Storms Moody, Wieugene, OR (US); Sunghan Kim, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 417 days.

(21) Appl. No.: 11/475,710

(22) Filed: Jun. 27, 2006

(65) Prior Publication Data

US 2007/0069184 A1 Mar. 29, 2007

Related U.S. Application Data

(60) Provisional application No. 60/694,279, filed on Jun. 27, 2005.

(51) Int. Cl.
*H01B 1/00* (2006.01)
(52) U.S. Cl. ........................ 252/500; 528/377
(58) Field of Classification Search ................ 252/500; 528/377, 378
See application file for complete search history.

(56) References Cited

U.S. PATENT DOCUMENTS

| 5,300,575 A | 4/1994 | Jonas et al. | |
| 5,463,005 A | 10/1995 | Desmarteau | |
| 6,303,238 B1 | 10/2001 | Thompson et al. | |
| 6,670,645 B2 | 12/2003 | Grushin et al. | |
| 7,317,047 B2 * | 1/2008 | Hsu | 524/165 |
| 7,455,793 B2 * | 11/2008 | Hsu et al. | 252/500 |
| 2004/0206942 A1 | 10/2004 | Hsu | |
| 2005/0222333 A1 * | 10/2005 | Hsu | 525/178 |
| 2007/0069185 A1 * | 3/2007 | Hsu et al. | 252/500 |

FOREIGN PATENT DOCUMENTS

| WO | WO 00/70655 A2 | 11/2000 |
| WO | WO 01/41512 A1 | 6/2001 |
| WO | WO 03/008424 A1 | 1/2003 |
| WO | WO 03/040257 A1 | 5/2003 |
| WO | WO 03/063555 A1 | 7/2003 |
| WO | WO 03/091688 A2 | 11/2003 |
| WO | WO 2004/016710 A1 | 2/2004 |

OTHER PUBLICATIONS

Kyunghoon Lee et. al., Poly(Thieno[3,4-b]Thiophene). A New Stable Low Band Gap Conducting Polymer, Macromolecules, 2001, vol. 34:5746-5747.

(Continued)

*Primary Examiner*—Mark Kopec
(74) *Attorney, Agent, or Firm*—John H. Lamming

(57) ABSTRACT

Electrically conducting polymer compositions are provided. The compositions comprise homopolymers and copolymers of polythiophene, polypyrrole, polyaniline, and polycyclic heteroaromatics, and combinations of those, in admixture with an organic solvent wettable fluorinated acid polymer. The acid polymers are fluorinated or highly fluorinated and have acidic groups including carboxylic acid groups, sulfonic acid groups, sulfonimide groups, phosphoric acid groups, phosphonic acid groups, and combinations thereof. The compositions may be used in organic electronic devices (OLEDs).

20 Claims, 1 Drawing Sheet

OTHER PUBLICATIONS

Gregory A. Sotzing et. al., Poly(Thieno[3,4-b]Thiopene): A p- and n-Dopable Polythiophene Exhibiting Optical Transparency in the Semiconducting State Macromolecules, 2002, vol. 35:7281-7286.

A. Feiring et. al., Aromatic Monomers With Pendant Fluoroalkylsulfonate and Sulfonimide Groups, J. Fluorine Chemistry, 2000, vol. 105:129-135.

A. Feiring et. al., Novel Aromatic Poolymers With Pendant Lithium Perfluoroalkylsulfonate or Sulfonimide, Macromolecules, 2000, vol. 33:9262-9271.

D.D. Desmarteau, Novel Perfluorinated Ionomers and Ionenes, J. Fluorine Chem., 1995, vol. 72:203-208.

A.J. Appleby et. al., Polymeric Perfluoro Bis-Sulfonimides As Possible Fuel Cell Electrolytes, J. Electrochem. Soc., 1993, vol. 140:109-111.

G. Gustafsson et. al., Flexible Light-Emitting Diodes Made From Soluble Conducting Polymers, Nature, 1992, vol. 357:477-479

Y. Wang, Kirk-Othmer Encyclopedia of Chemical Technology, Fourth Edition, 1996, vol. 18:837-860.

PCT International Search Report and Writtten Opinion for International Application No. PCT/US06/25014 dated Jul. 25, 2007.

\* cited by examiner

ELECTRICALLY CONDUCTIVE POLYMER COMPOSITIONS

RELATED U.S. APPLICATIONS

This application claims priority to U.S. provisional application Ser. No. 60/694,279, filed Jun. 27, 2005.

BACKGROUND INFORMATION

1. Field of the Disclosure

This disclosure relates in general to electrically conductive polymer compositions, and their use in organic electronic devices.

2. Description of the Related Art

Organic electronic devices define a category of products that include an active layer. Such devices convert electrical energy into radiation, detect signals through electronic processes, convert radiation into electrical energy, or include one or more organic semiconductor layers.

Organic light-emitting diodes (OLEDs) are organic electronic devices comprising an organic layer capable of electroluminescence. OLEDs containing conducting polymers can have the following configuration:

anode/buffer layer/EL material/cathode

Additional, optional layers, materials or compositions may be incorporated into this general structure. The anode is typically any material that has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. Typical conducting polymers employed as buffer layers include polyaniline and polydioxythiophenes such as poly(3,4-ethylenedioxythiophene) (PEDT). These materials can be prepared by polymerizing aniline or dioxythiophene monomers in aqueous solution in the presence of a water soluble polymeric acid, such as poly (styrenesulfonic acid) (PSS), as described in, for example, U.S. Pat. No. 5,300,575.

The aqueous electrically conductive polymer dispersions synthesized with water soluble non-fluorinated polymeric acids have undesirably low pH levels. The low pH can contribute to decreased stress life of an EL device containing such a buffer layer, and contribute to corrosion within the device. Accordingly, there is a need for compositions and layers prepared therefrom having improved properties.

Electrically conducting polymers which have the ability to carry a high current when subjected to a low electrical voltage, also have utility as electrodes for electronic devices, such as thin film field effect transistors. In such transistors, an organic semiconducting film which has high mobility for electron and/or hole charge carriers, is present between source and drain electrodes. A gate electrode is on the opposite side of the semiconducting polymer layer. To be useful for the electrode application, the electrically conducting polymers and the liquids for dispersing or dissolving the electrically conducting polymers have to be compatible with the semiconducting polymers and the solvents for the semiconducting polymers to avoid re-dissolution of either conducting polymers or semiconducting polymers. Many conductive polymers have conductivities which are too low for use as electrodes. Accordingly, there is a need for improved conductive polymers.

Thus, there is a continuing need for electrically conductive polymer compositions having improved chemical, physical and electrical properties.

SUMMARY

There is provided an electrically conductive polymer composition comprising a doped electrically conductive polymer in admixture with an organic solvent wettable fluorinated acid polymer.

In one embodiment, the polymeric acid is a water-soluble fluorinated sulfonic acid polymer.

In another embodiment, there is provided an aqueous dispersion of a doped electrically conductive polymer in admixture with an organic solvent wettable fluorinated acid polymer.

In another embodiment, electronic devices comprising at least one layer comprising the new conductive polymer composition are provided.

Figure 1:
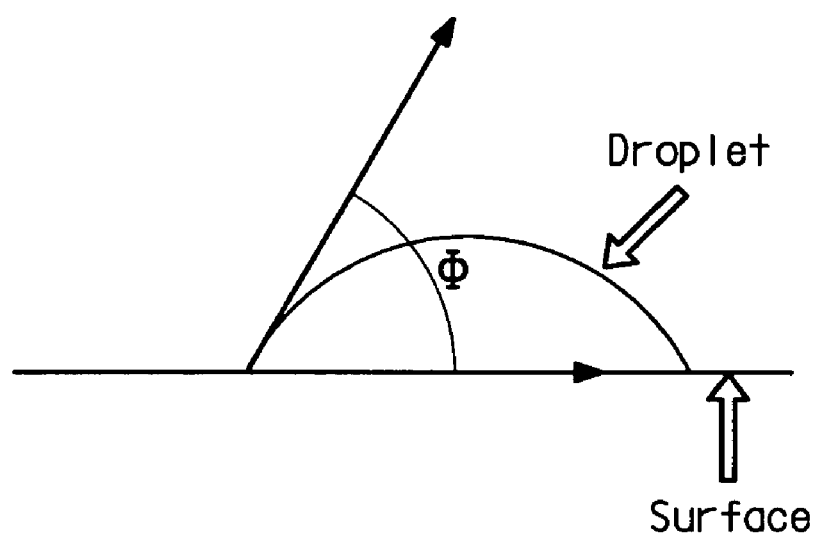
FIG. 1 is a diagram illustrating contact angle.

The figure(s) are provided by way of example and are not intended to limit the invention. Skilled artisans appreciate that objects in the figures are illustrated for simplicity and clarity and have not necessarily been drawn to scale. For example, the dimensions of some of the objects in the figures may be magnified relative to other objects to help to improve understanding of embodiments.

The foregoing general description and the following detailed description are exemplary and explanatory and are not restrictive of the invention, as defined in the appended claims.

DETAILED DESCRIPTION

In one embodiment, there is provided an electrically conductive polymer composition comprising a doped electrically conductive polymer in admixture with an organic solvent wettable fluorinated acid polymer.

Many aspects and embodiments are described herein and are exemplary and not limiting. After reading this specification, skilled artisans will appreciate that other aspects and embodiments are possible without departing from the scope of the disclosure and appended claims.

As used herein, the term "electrically conductive polymer" refers to any polymer or oligomer that is inherently or intrinsically capable of electrical conductivity without the addition of carbon black or conductive metal particles. The term "polymer" includes homopolymers and copolymers. The term "electrical conductivity" includes conductive and semiconductive. In one embodiment, films made from the doped electrically conductive polymer have a conductivity of at least $10^{-7}$ S/cm. The term "doped" is intended to mean that the electrically conductive polymer has a polymeric counterion to balance the charge on the conductive polymer. The term "organic solvent wettable" refers to a material which, when formed into a film, is wettable by organic solvents. The term also includes polymeric acids which are not film-forming alone, but that form an electrically conductive composition that is wettable. In one embodiment, the film of the organic solvent wettable material is wettable by phenylhexane with a contact angle less than 40°. The term "fluorinated acid polymer" refers to a polymer having acidic groups, where at least some of the hydrogens have been replaced by fluorine. The term "acidic group" refers to a group capable of ionizing to donate a hydrogen ion. The term "in admixture with" is intended to mean that a doped electrically conductive polymer is physically mixed with an organic solvent wettable fluorinated acid polymer. The composition may comprise one or more different conductive polymers and one or more different organic solvent wettable fluorinated acid polymers.

The conductive polymers suitable for the new composition can be homopolymers, or they can be co-polymers of two or more respective monomers, which may vary as structural repeat units or which may vary as the same structural repeat unit with different substituents. The composition may comprise one or more different conductive polymers and one or more different organic solvent wettable fluorinated acid polymer. In one embodiment, the conductive polymer is selected from polythiophenes, polypyrroles, polyanilines, and polycyclic aromatic polymers. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring.

The monomer from which the conductive polymer is formed, is referred to as a "precursor monomer". A copolymer will have more than one precursor monomer.

In one embodiment, polythiophenes contemplated for use in the new composition comprise Formula I below:

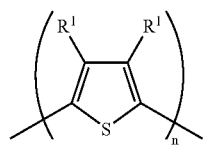

(I)

wherein:

R$^1$ is independently selected so as to be the same or different at each occurrence and is selected from hydrogen, alkyl, alkenyl, alkoxy, alkanoyl, alkythio, aryloxy, alylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both R$^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

"alcohol" —R$^3$—OH
"amido" —R$^3$—C(O)N(R$^6$)R$^6$
"amidosulfonate" —R$^3$—C(O)N(R$^6$)R$^4$—SO$_3$Z
"benzyl" —CH$_2$—C$_6$H$_5$
"carboxylate" —R$^3$—C(O)O-Z or —R$^3$—O—C(O)-Z
"ether" —R$^3$—(O—R$^5$)$_p$—O—R$^5$
"ether carboxylate" —R$^3$—O—R$^4$—C(O)O-Z or —R$^3$—O—R$^4$—O—C(O)-Z
"ether sulfonate" —R$^3$—O—R$^4$—SO$_3$Z
"ester sulfonate" —R$^3$—O—C(O)R$^4$—SO$_3$Z
"sulfonimide" —R$^3$—SO$_2$—NH—SO$_2$—R$^5$
"urethane" —R$^3$—O—C(O)—N(R$^6$)$_2$ where all "R" groups are the same or different at each occurrence and:

R$^3$ is a single bond or an alkylene group
R$^4$ is an alkylene group
R$^5$ is an alkyl group
R$^6$ is hydrogen or an alkyl group
p is 0 or an integer from 1 to 20
Z is H, alkali metal, alkaline earth metal, N(R$^5$)$_4$ or R$^5$ Any of the above groups may further be unsubstituted or substituted, and any group may have F substituted for one or more hydrogens, including perfluorinated groups.

In one embodiment, in the polythiophene both R$^1$ together form —O—(CHY)$_m$—O—, where m is 2 or 3, and Y is the same or different at each occurrence and is selected from hydrogen, alkyl, alcohol, amidosulfonate, benzyl, carboxylate, ether, ether carboxylate, ether sulfonate, ester sulfonate, and urethane. In one embodiment, all Y are hydrogen. In one embodiment, the polythiophene is poly(3,4-ethylenedioxythiophene) ("PEDT"). In one embodiment, at least one Y group is not hydrogen. In one embodiment, at least one Y group is a substituent having F substituted for at least one hydrogen. In one embodiment, at least one Y group is perfluorinated.

In one embodiment, the polythiophene has Formula I(a):

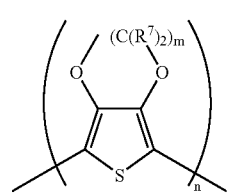

(Ia)

wherein:

R$^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one R$^7$ is not hydrogen.

m is 2 or 3, and n is at least about 4.

In one embodiment of Formula I(a), m is two, one R$^7$ is an alkyl group of more than 5 carbon atoms, and all other R$^7$ are hydrogen. In one embodiment of Formula I(a), at least one R$^7$ group is fluorinated. In one embodiment, at least one R$^7$ group has at least one fluorine substituent. In one embodiment, the R$^7$ group is fully fluorinated.

In one embodiment of Formula I(a), the $R^7$ substituents on the fused alicyclic ring on the thiophene offer improved solubility of the monomers in water and facilitate polymerization in the presence of the fluorinated acid polymer.

In one embodiment of Formula I(a), m is 2, one $R^7$ is sulfonic acid-propylene-ether-methylene and all other $R^7$ are hydrogen. In one embodiment, m is 2, one $R^7$ is propyl-ether-ethylene and all other $R^7$ are hydrogen. In one embodiment, m is 2, one $R^7$ is methoxy and all other $R^7$ are hydrogen. In one embodiment, one $R^7$ is sulfonic acid difluoromethylene ester methylene ($-CH_2-O-C(O)-CF_2-SO_3H$), and all other $R^7$ are hydrogen.

In one embodiment, polypyrroles contemplated for use in the new composition comprise Formula II below.

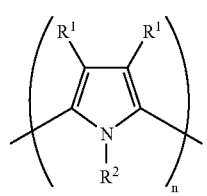

(II)

where in Formula II:
n is at least about 4;
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and
$R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the polypyrrole is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form $-O-(CHY)_m-O-$, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In one embodiment, at least one Y group is not hydrogen. In one embodiment, at least one Y group is a substituent having F substituted for at least one hydrogen. In one embodiment, at least one Y group is perfluorinated.

Polyanilines contemplated for use in the new composition comprise Formula III or Formula IV below.

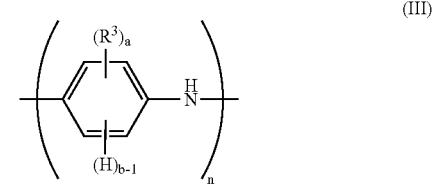

(III)

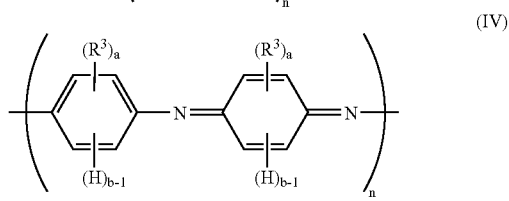

(IV)

wherein:
n is at least about 4;
a is an integer from 0 to 4;
b is an integer from 1 to 5, with the proviso that a+b=5; and
$R^3$ is independently selected so as to be the same or different at each occurrence and is selected from alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, a is not 0 and at least one $R^3$ is fluorinated. In one embodiment, at least one $R^3$ is perfluorinated.

In one embodiment, the polyaniline is unsubstituted and p=0. This material is referred to herein with the abbreviation "PANI".

In one embodiment, polymeric fused polycylic heteroaromatics contemplated for use in the new composition are polymers derived from monomeric compounds having two or more fused aromatic rings, at least one of which is heteroaromatic. In one embodiment, the fused polycyclic heteroaromatic monomer has Formula V:

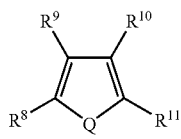

(V)

wherein:

Q is S or NH;

$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur or oxygen atoms.

In one embodiment, the fused polycyclic heteroaromatic monomer has Formula V(a), V(b), V(c), V(d), V(e), V(f), and V(g):

(Va)

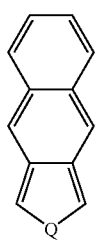

(Vb)

(Vc)

-continued

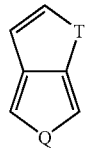

(Vd)

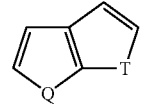

(Ve)

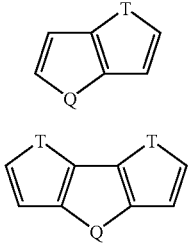

(Vf)

(Vg)

wherein:

Q is S or NH; and

T is the same or different at each occurrence and is selected from S, $NR^6$, O, $SiR^6_2$, Se, and $PR^6$;

$R^6$ is hydrogen or alkyl.

The fused polycyclic heteroaromatic precursor monomers may be further substituted with groups selected from alkyl, heteroalkyl, alcohol, benzyl, carboxylate, ether, ether carboxylate, ether sulfonate, and urethane. In one embodiment, the substituent groups are fluorinated. In one embodiment, the substituent groups are fully fluorinated.

In one embodiment, the fused polycyclic heteroaromatic precursor monomer is a thieno(thiophene). Such compounds have been discussed in, for example, Macromolecules, 34, 5746-5747 (2001); and Macromolecules, 35, 7281-7286 (2002). In one embodiment, the thieno(thiophene) is selected from thieno(2,3-b)thiophene, thieno(3,2-b)thiophene, and thieno(3,4-b)thiophene. In one embodiment, the thieno(thiophene)monomer is substituted with at least one group selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, the electrically conductive polymer is derived from a precursor monomer having Formula VI:

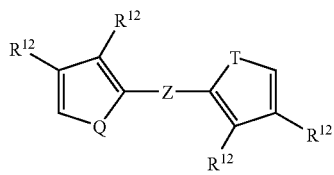

(VI)

wherein:

Q is S or $NR^6$;

T is selected from S, $NR^6$, O, $SiR^6_2$, Se, and $PR^6$;

Z is selected from alkenylene, arylene, and heteroarylene;

$R^6$ is hydrogen or alkyl;

$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, the electrically conductive polymer is a copolymer of a precursor monomer and at least one second monomer. Any type of second monomer can be used, so long as it does not detrimentally affect the desired properties of the copolymer. In one embodiment, the second monomer comprises no more than 50% of the copolymer, based on the total number of monomer units. In one embodiment, the second monomer comprises no more than 30%, based on the total number of monomer units. In one embodiment, the second monomer comprises no more than 10%, based on the total number of monomer units.

Exemplary types of second monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In one embodiment, the copolymers are made by first forming an intermediate precursor monomer having the structure A-B-C, where A and C represent first precursor monomers, which can be the same or different, and B represents a second precursor monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In one embodiment, the electrically conductive polymer is a copolymer of two or more precursor monomers. In one embodiment, the precursor monomers are selected from a thiophene, a pyrrole, an aniline, and a polycyclic aromatic.

In one embodiment, the electrically conductive organic polymers used in the new compositions and methods are prepared by oxidatively polymerizing the corresponding monomers in aqueous solution containing a water soluble acid. In one embodiment, the acid is a water-soluble non-fluorinated polymeric acid. In one embodiment, the acid is a non-fluorinated polymeric sulfonic acid. Some non-limiting examples of the acids are poly(styrenesulfonic acid) ("PSSA"), poly(2-acrylamido-2-methyl-1-propanesulfonic acid) ("PAAMPSA"), and mixtures thereof. The acid anion provides the dopant for the conductive polymer. The oxidative polymerization is carried out using an oxidizing agent such as ammonium persulfate, sodium persulfate, and mixtures thereof. Thus, for example, when aniline is oxidatively polymerized in the presence of PMMPSA, the doped electrically conductive polymer PANI/PAAMPSA is formed. When ethylenedioxythiophene (EDT) is oxidatively polymerized in the presence of PSSA, the doped electrically conductive polymer PEDT/PSS is formed. The conjugated backbone of PEDT is partially oxidized and positively charged. Oxidatively polymerized pyrroles and thienothiophenes also have a positive charge which is balanced by the acid anion. Electrically conductive polythiophenes and polyanilines are also available commercially.

The organic-solvent wettable fluorinated acid polymer can be any water-soluble or water dispersible polymer which is fluorinated and has acidic groups. Fluorination can occur on the polymer backbone, side chains, or pendant groups, or combinations of those. As used herein, the term "fluorinated" means that at least one hydrogen bonded to a carbon has been replaced with a fluorine. The term includes partially and fully fluorinated materials. In one embodiment, the fluorinated acid polymer is highly fluorinated. The term "highly fluorinated" means that at least 50% of the available hydrogens bonded to a carbon, have been replaced with fluorine. The acidic groups supply an ionizable proton. In one embodiment, the acidic group has a pKa of less than 3. In one embodiment, the acidic group has a pKa of less than 0. In one embodiment, the acidic group has a pKa of less than −5. The acidic group can be attached directly to the polymer backbone, or it can be attached to side chains or pendant groups on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the organic solvent wettable fluorinated acid polymer forms a film which is wettable by phenylhexane. In one embodiment, phenylhexane forms drops having a contact angle no greater than 40°. As used herein, the term "contact angle" is intended to mean the angle $\phi$ shown in FIG. 1. For a droplet of liquid medium, angle $\phi$ is defined by the intersection of the plane of the surface and a line from the outer edge of the droplet to the surface. Furthermore, angle $\phi$ is measured after the droplet has reached an equilibrium position on the surface after being applied, i.e., "static contact angle". The film of the organic solvent wettable fluorinated acid polymer is represented as the surface. In one embodiment, the contact angle is no greater than 35°. In one embodiment, the contact angle is no greater than 30°. The methods for measuring contact angles are well known.

In one embodiment of the organic solvent wettable fluorinated acid polymer, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are selected from sulfonic acid groups and sulfonimide groups. In one embodiment, the acidic groups are on a fluorinated side chain. In one embodiment, the fluorinated side chains are selected from alkyl groups, alkoxy groups, amido groups, ether groups, and combinations thereof.

In one embodiment, the fluorinated acid polymer has a fluorinated olefin backbone, with pendant fluorinated ether sulfonate groups or fluorinated ether sulfonimide groups. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the fluorinated acid polymer is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In one embodiment, the fluorinated acid polymer is a homopolymer or copolymer of monomers having Formula VII:

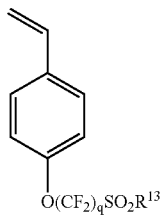

(VII)

where:
q is an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer is "SFS" or "SFSI" shown below:

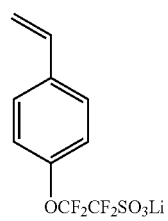

SFS

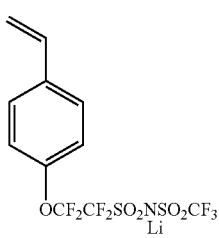

SFSI

After polymerization, the polymer can be converted to the acid form.

In one embodiment, the fluorinated acid polymer is a homopolymer or copolymer of a trifluorostyrene having acidic groups. In one embodiment, the trifluorostyrene monomer has Formula VIII:

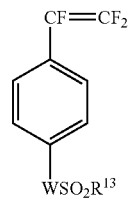

(VIII)

where:
W is selected from $(CF_2)_q$, $O(CF_2)_q$, $S(CF_2)_q$, $(CF_2)_qO(CF_2)_r$, and $SO_2(CF_2)_q$,
q and r are independently an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer containing W equal to $S(CF_2)_q$ is polymerized then oxidized to give the polymer containing W equal to $SO_2(CF_2)_q$. In one embodiment, the polymer containing $R^{13}$ equal to F is converted its acid form where $R^{13}$ is equal to OH or $NHR^{14}$.

In one embodiment, the fluorinated acid polymer is a sulfonamide polymer having Formula IX:

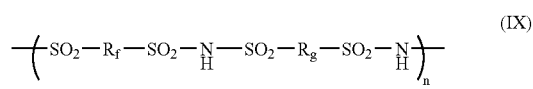

(IX)

where:
$R_f$ is selected from fluorinated alkylene, fluorinated heteroalkylene, fluorinated arylene, or fluorinated heteroarylene;
$R_g$ is selected from fluorinated alkylene, fluorinated heteroalkylene, fluorinated arylene, fluorinated heteroarylene, arylene, or heteroarylene; and
n is at least 4.

In one embodiment of Formula IX, $R_f$ and $R_g$ are perfluoroalkylene groups. In one embodiment, $R_f$ and $R_g$ are perfluorobutylene groups. In one embodiment, $R_f$ and $R_g$ contain ether oxygens. In one embodiment, n is greater than 20.

In one embodiment, the water-soluble fluorinated acid polymer comprises a fluorinated polymer backbone includes a side chain having Formula X:

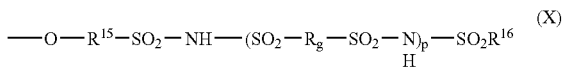

(X)

where:
$R_g$ is selected from fluorinated alkylene, fluorinated heteroalkylene, fluorinated arylene, fluorinated heteroarylene, arylene, or heteroarylene;
$R^{15}$ is a fluorinated alkylene group or a fluorinated heteroalkylene group;
$R^{16}$ is a fluorinated alkyl or a fluorinated aryl group; and
p is 0 or an integer from 1 to 4.

In one embodiment, the organic-solvent wettable fluorinated acid polymer has Formula XI:

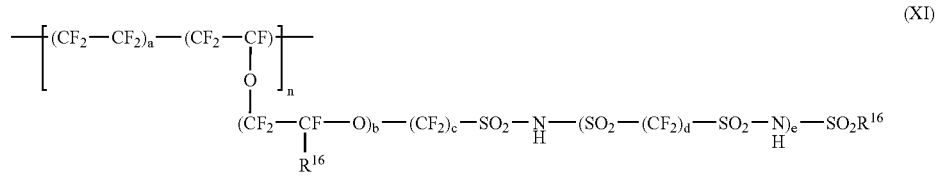

(XI)

where:

$R^{16}$ is a fluorinated alkyl or a fluorinated aryl group;

a, b, c, d, and e are each independently 0 or an integer from 1 to 4; and n is at least 4.

The synthesis of fluorinated acid polymers has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the wettable organic solvent wettable fluorinated acid polymer comprises at least one repeat unit derived from an ethylenically unsaturated compound having Formula XII:

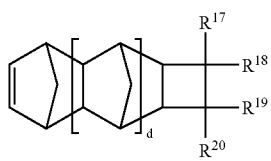

(XII)

wherein d is 0, 1, or 2;

$R^{17}$ to $R^{20}$ are independently H, halogen, alkyl or alkoxy of 1 to 10 carbon atoms, Y, $C(R_f')(R_f')OR^{21}$, $R^4Y$ or $OR^4Y$;

Y is $COE^2$, $SO_2 E^2$, or sulfonimide;

$R^{21}$ is hydrogen or an acid-labile protecting group;

$R_f'$ is the same or different at each occurrence and is a fluoroalkyl group of 1 to 10 carbon atoms, or taken together are $(CF_2)_e$ where e is 2 to 10;

$R^4$ is an alkylene group;

$E^2$ is OH, halogen, or $OR^7$; and $R^5$ is an alkyl group;

with the proviso that at least one of $R^{17}$ to $R^{20}$ is Y, $R^4Y$ or $OR^4Y$.

$R^4$, $R^5$, and $R^{17}$ to $R^{20}$ may optionally be substituted by halogen or ether oxygen.

Some illustrative, but nonlimiting, examples of representative monomers of Formula XII are presented below as Formulas XIIa-XIIe:

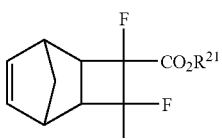

(XIIa)

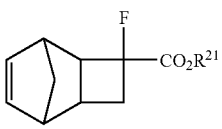

(XIIb)

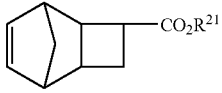

(XIIc)

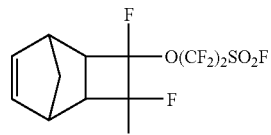

(XIId)

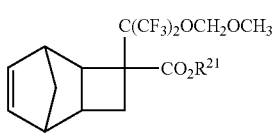

(XIIe)

wherein $R^{21}$ is a group capable of forming or rearranging to a tertiary cation, more typically an alkyl group of 1 to 20 carbon atoms, and most typically t-butyl.

Compounds of Formula XII wherein d=0, (e.g., Formula XII-a), may be prepared by cycloaddition reaction of unsaturated compounds of structure (XIII) with quadricyclane (tetracyclo[2.2.1.0$^{2,6}$0$^{3,5}$]heptane) as shown in the equation below.

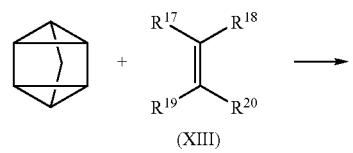

(XIII)

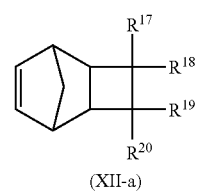

(XII-a)

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of structure (XII) with higher values of d (i.e., d=1 or 2) may be prepared by reaction of compounds of structure (XII) with d=0 with cyclopentadiene, as is known in the art.

In one embodiment, the organic solvent wettable fluorinated acid polymer is a copolymer which also comprises a repeat unit derived from at least one fluoroolefin, which is an ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the organic solvent wettable fluorinated acid polymer is water soluble. In one embodiment, the acid forms a colloidal dispersion in water. In one embodiment, the acid is dispersible in water to form a homogeneous composition.

The new electrically conductive polymer composition is prepared by blending the electrically conductive polymer with the organic solvent wettable fluorinated acid polymer. This can be accomplished by adding an aqueous dispersion of the electrically conductive polymer to a dispersion or solution of the polymeric acid. In one embodiment, the composition is further treated using sonication or microfluidization to ensure mixing of the components.

In one embodiment, one or both of the doped electrically conductive polymer and polymeric acid are isolated in solid form. The solid material can be redispersed in water or in an aqueous solution or dispersion of the other component. For example, doped electrically conductive polymer solids can be dispersed in an aqueous solution or dispersion of an organic solvent wettable fluorinated acid polymer.

As synthesized, the aqueous dispersions of the new conductive polymer composition generally have a very low pH. It has been found that the pH can be adjusted to higher values, without adversely affecting the properties in devices. In one embodiment, the pH of the dispersion can be adjusted to about 1.5 to about 4. In one embodiment, the pH is adjusted to between 2 and 3. It has been found that the pH can be adjusted using known techniques, for example, ion exchange or by titration with an aqueous basic solution.

In one embodiment, after the electrically conductive polymer and polymeric acid are blended, the as-formed aqueous dispersion is contacted with at least one ion exchange resin under conditions suitable to remove any remaining decomposed species, side reaction products, and unreacted monomers, and to adjust pH, thus producing a stable, aqueous dispersion with a desired pH. In one embodiment, the as-formed aqueous dispersion is contacted with a first ion exchange resin and a second ion exchange resin, in any order. The as-formed aqueous dispersion can be treated with both the first and second ion exchange resins simultaneously, or it can be treated sequentially with one and then the other.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-formed aqueous dispersion either simultaneously, or consecutively. For example, in one embodiment both resins are added simultaneously to an as-formed aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-formed aqueous dispersion. Moreover, the basic, anion exchange and/or acidic, cation exchange resins renders the acidic sites more basic, resulting in increased pH of the dispersion. In general, about one to five grams of ion exchange resin is used per gram of new conductive polymer composition.

In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

In another embodiment, more conductive dispersions are formed by the addition of highly conductive additives to the aqueous dispersions of the new conductive polymer composition. Because dispersions with relatively high pH can be formed, the conductive additives, especially metal additives, are not attacked by the acid in the dispersion. Examples of suitable conductive additives include, but are not limited to metal particles and nanoparticles, nanowires, carbon nanotubes, graphite fibers or particles, carbon particles, and combinations thereof.

In another embodiment of the invention, there are provided buffer layers deposited from aqueous dispersions comprising the new conductive polymer composition. The term "layer" is used interchangeably with the term "film" and refers to a coating covering a desired area. The intended meaning of the term is not limited by considerations of size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

In some embodiments, the dried films of the new conductive polymer composition are not redispersible in water. Thus the buffer layer can be applied as multiple thin layers. In addition, the buffer layer can be overcoated with a layer of different water-soluble or water-dispersible material without being damaged. Buffer layers comprising the new conductive polymer composition have been surprisingly found to have improved wettability.

In another embodiment, there are provided buffer layers deposited from aqueous dispersions comprising the new conductive polymer composition blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers. Examples of suitable polymers include, but are not limited to, conductive polymers such as polythiophenes, polyanilines, polypyrroles, polyacetylenes, and combinations thereof.

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electro-radiative properties. An electroactive layer material may emit radiation or exhibit a change in concentration of electron-hole pairs when receiving radiation.

Figure 2:
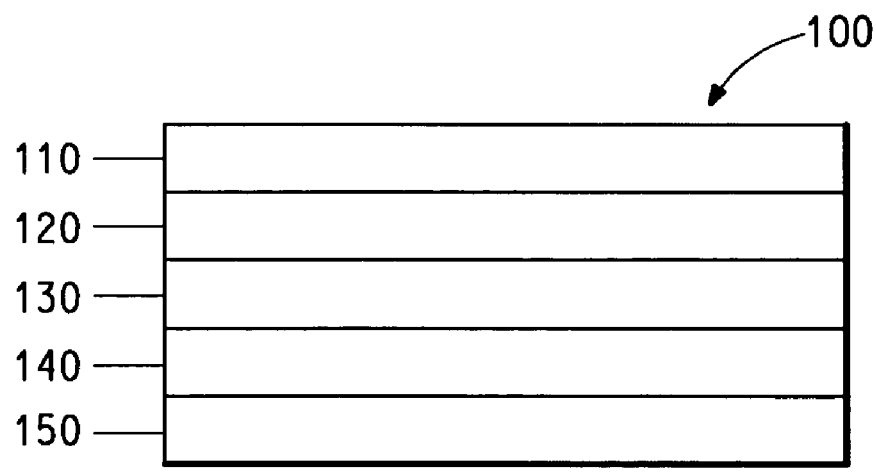
FIG. 2 is a schematic diagram of an organic electronic device.

As shown in FIG. 2, a typical device, 100, has an anode layer 110, a buffer layer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer layer 120 is usually deposited onto substrates using a variety of techniques well-known to those skilled in the art. Typical deposition techniques, as discussed above, include liquid deposition (continuous and discontinuous techniques), and thermal transfer.

An optional layer, not shown, may be present between the buffer layer 120 and the electroactive layer 130. This layer may comprise hole transport materials. Examples of hole transport materials for this optional layer have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, poly[9,9,-dioctyl-fluorene-co-N-(4-butylphenyl)diphenylamine), and the like, polyvinylcarbazole, (phenylmethyl) polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinolato)(para-phenyl-phenolato)aluminum(III) (BAlQ), tetra(8-hydroxyquinolato)zirconium (ZrQ), and tris(8-hydroxyquinolato)aluminum (Alq$_3$); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

It is understood that the device 100 may comprise additional layers though such layers are not depicted in FIG. 2. Other layers that are known in the art or otherwise may be used. In addition, any of the above-described layers may comprise two or more sub-layers or may form a laminar structure. Alternatively, some or all of anode layer 110 the buffer layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In various embodiments, the different layers have the following ranges of thicknesses: anode 110, 500-5000 Å, in one embodiment 1000-2000 Å; buffer layer 120, 50-2000 Å, in one embodiment 200-1000 Å; optional hole transporting, 50-2000 Å, in one embodiment 100-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components of the invention. This is done merely for convenience and to give a general sense of the invention. This description should be read to include one or at least one and the singular also includes the plural unless it is obvious that it is meant otherwise.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "electron transport" means when referring to a layer, material, member or structure, such a layer, material, member or structure that promotes or facilitates migration of negative charges through such a layer, material, member or structure into another layer, material, member or structure.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

Unless otherwise defined, all technical and scientific terms used herein have the same meaning as commonly understood by one of ordinary skill in the art to which this invention belongs. In the Formulae, the letters Q, R, T, Y, and Z are used to designate atoms or groups which are defined within. All other letters are used to designate conventional atomic symbols. Group numbers corresponding to columns within the Periodic Table of the elements use the "New Notation" convention as seen in the *CRC Handbook of Chemistry and Physics*, 81$^{st}$ Edition (2000).

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

Example 1

This example illustrates the preparation of an organic solvent wettable sulfonic acid polymer to be used in the preparation of a new conductive polymer composition. The polymer is a copolymer of 1,1-difluoroethylene ("VF$_2$") and 2-(1,1-difluoro-2-(trifluoromethyl)allyloxy)-1,1,2,2-tetrafluoroethanesulfonyl fluoride ("PSEBVE"), which has been converted to the sulfonic acid form. The resulting polymer is referred to as "VF$_2$-PSSEBVE".

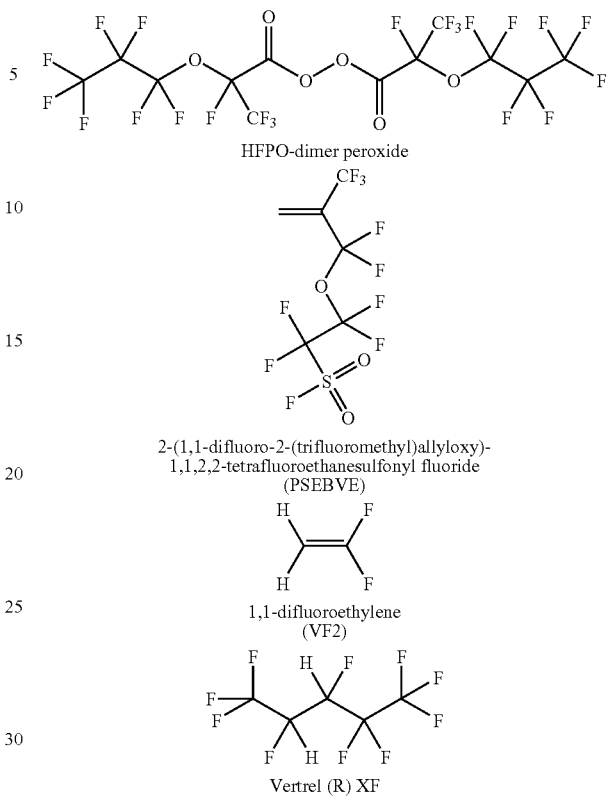

HFPO-dimer peroxide 2-(1,1-difluoro-2-(trifluoromethyl)allyloxy)-
1,1,2,2-tetrafluoroethanesulfonyl fluoride
(PSEBVE)

1,1-difluoroethylene
(VF2)

Vertrel (R) XF

A 400 mL Hastelloy C276 reaction vessel was charged with 160 mL of Vertrel® XF, 4 mL of a 20 wt. % solution of HFPO dimer peroxide in Vertrel® XF, and 143 g of PSEBVE (0.42 mol). The vessel was cooled to −35° C., evacuated to −3 PSIG, and purged with nitrogen. The evacuate/purge cycle was repeated two more times. To the vessel was then added 29 g VF$_2$ (0.45 mol). The vessel was heated to 28° C., which increased the pressure to 92 PSIG. The reaction temperature was maintained at 28° C. for 18 h. at which time the pressure had dropped to 32 PSIG. The vessel was vented and the crude liquid material was recovered. The Vertrel® XF was removed in vacuo to afford 110 g of desired copolymer.

Conversion of the sulfonyl fluoride copolymer prepared above to sulfonic acid was carried out in the following manner. 20 g of dried polymer and 5.0 g lithium carbonate were refluxed in 100 mL dry methanol for 12 h. The mixture was brought to room temperature and filtered to remove any remaining solids. The methanol was removed in vacuo to isolate the lithium salt of the polymer. The lithium salt of the polymer was then dissolved in water and added with Amberlyst 15, a protonic acid exchange resin which had been washed thoroughly with water until there was no color in the water. The mixture was stirred and filtered. Filtrate was added with fresh Amberlyst 15 resin and filtered again. The step was repeated two more times. Water was then removed from the final filtrates and the solids were then dried in a vacuum oven.

Films made from VF$_2$-PSEBVE acid are wettable by organic solvents. Phenylhexane will have a contact angle less than 40° on the films.

Example 2

This example illustrates the preparation of an organic solvent wettable sulfonic acid polymer to be used in the preparation of a new conductive polymer composition. The polymer is a copolymer of ethylene ("E") and 2-(2-(1,2,2-trifluorovinyloxy)-1,1,2,3,3,3-hexafluoropropoxy)-1,1,2,2-tetrafluoroethanesulfonyl fluoride ("PSEPVE"), which has been converted to the sulfonic acid form. The resulting polymer is referred to as "E-PSEPVE acid".

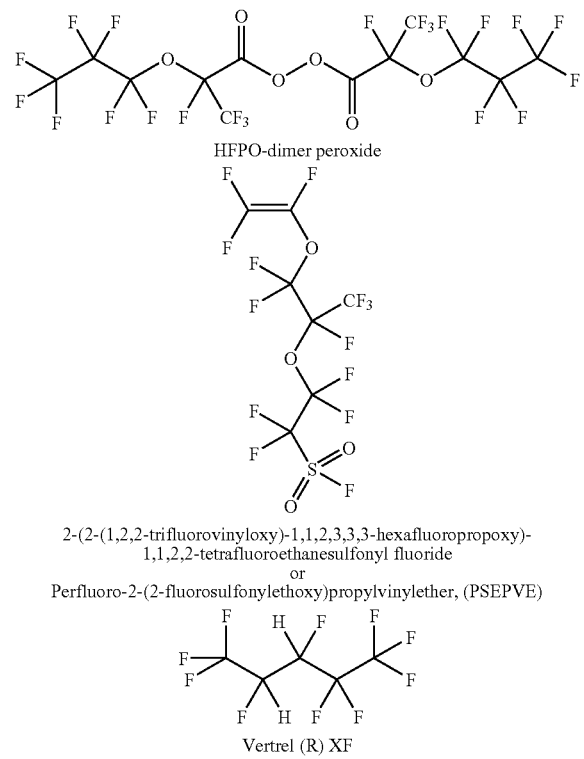

2-(2-(1,2,2-trifluorovinyloxy)-1,1,2,3,3,3-hexafluoropropoxy)-
1,1,2,2-tetrafluoroethanesulfonyl fluoride
or
Perfluoro-2-(2-fluorosulfonylethoxy)propylvinylether, (PSEPVE)

Vertrel (R) XF

A 210 mL Hastelloy C276 reaction vessel was charged with 60 g of PSEPVE (0.13 mol) and 1 mL of a 0.17 M solution of HFPO dimer peroxide in Vertrel® XF. The vessel was cooled to −35° C., evacuated to −3 PSIG, and purged with nitrogen. The evacuate/purge cycle was repeated two more times. To the vessel was then added 20 g ethylene (0.71 mol) and an additional 900 PSIG of nitrogen gas. The vessel was heated to 24° C., which increased the pressure to 1400 PSIG. The reaction temperature was maintained at 24° C. for 18 h. at which time the pressure had dropped to 1350 PSIG. The vessel was vented and 61.4 g of crude material was recovered, 10 g of this material were dried at 85° C. and 20 milliTorr for 10 h. to give 8.7 g of dried polymer.

Conversion of the sulfonyl fluoride copolymer prepared above to sulfonic acid was carried out in the following manner. A mixture of 19.6 g of dried polymer and 5.6 g lithium carbonate were refluxed in 300 mL dry methanol for 6 h. The mixture was brought to room temperature and filtered to remove any remaining solids. The methanol was removed in vacuo to afford 15.7 g of the lithium salt of the polymer. The lithium salt of the polymer was then dissolved in water and added with Amberlyst 15, a protonic acid exchange resin which had been washed thoroughly with water until there was no color in the water. The mixture was stirred and filtered. Filtrate was added with fresh Amberlyst 15 resin and filtered again. The step was repeated two more times. Water was then removed from the final filtrates and the solids were then dried in a vacuum oven.

Films made from E-PSEPVE acid are wettable by organic solvents. Phenylhexane will have a contact angle less than 40° on the films.

Example 3

This example illustrates the preparation of a conductive polymer composition by blending a commercially available electrically conductive polymer with an organic solvent wettable fluorinated acid polymer. The electrically conductive polymer was PEDT/PSS. The organic solvent wettable fluorinated acid polymer was E-PSEPVE acid from Example 2.

24.36 g of the E-PSEPVE acid solution were dripped in to mix with 45.64 g Baytron-P® Al4083 (a trade name for PEDT/PSS from H. C. Starck, Mass., USA, with solid: 1.5%, pH~1.7; 1:6 w/w ratio between PEDT/PSS) in a 250 mL round-bottom flask while being stirred with a magnetic stirrer. The resulting mixture contained 1.67% solid and its pH was 1.9. Its dried (baked at 130° C. for 45 minutes) film conductivity was $3.6 \times 10^{-5}$ S/cm. The dried film was also tested for contact angle. The contact angle measurement is described below. A goniometer was used to dispense 3.0 μL drops of phenylhexane. Once a drop was dispensed, a snapshot was immediately taken, giving a visual outline of the drop. Each measurement calculated a right and left value for the contact angle. It was determined to be 30°. This contact angle is very low, indicating that its film surface is easy to wet with organic solvents such as p-xylene, toluene. The solvents are common ones for dissolving light emitting materials.

The Baytron-P®/E-PSEPVE acid blend was then tested for device performance. The blend was spun on a 6"×6" glass plate. The plate had an ITO thickness of 100 to 150 nm and consisted of 16 backlight substrates. Each substrate consisted of 3 pieces of 5 mm×5 mm pixel and 1 piece of 2 mm×2 mm pixel for light emission. The spin-coated films as buffer layer layers were then baked at 130° C. in air for 30 minutes. The thickness of the baked buffer layers were ~70 nm. For the light-emitting layer, a 1% (w/v) toluene solution of Lumination Green from Dow Chemicals (Midland, Mich.) was spin-coated on top of the buffer layer films and subsequently baked at 100° C. in vacuum for 30 minutes. The final thickness was ~740 Å. Immediately after, a 3 nm thick barium layer and a 350-400 nm aluminum layer were deposited on the Lumination Green films to serve as a cathode. The device data is shown in Table 1. The data clearly shows that devices made with Baytron-P®/E-PSEPVE acid copolymer have lower voltage, and higher efficiency and stress-life than Baytron-P®.

Example 4

This example illustrates a new conductive polymer composition formed by blending Baytron-P® A14083 (Lot# HCD04P012, solid: 1.5%, pH~1.7; 1:6 w/w ratio between PEDT/PSS) with an aqueous solution of 2.5% (w/w) VF2/PSEBVE sulfonic acid made in Example 1.

18.81 g of the VF2/PSEBVE acid solution were dripped in to mix with 51.20 g Baytron-P® in a 250 mL round-bottom flask while being stirred with a magnetic stirrer. The resulting mixture contained 1.77% solid and its pH was 1.7. Its dried (baked at 130° C. for 45 minutes) film conductivity was $4.6 \times 10^{-5}$ S/cm. The dried film was also tested for contact angle by the method described in Example 3. It was determined to be 27.1 degree. This contact angle is very low, indicating that its film surface is easy to wet with organic solvents such as p-xylene, toluene. The solvents are common ones for dissolving light emitting materials. The device using Baytron-P®/VF2-PSEBVE acid blend as a buffer layer was made and then tested for device performance in the same manner as described in Example 3. The device data is shown in Table 1 and clearly shows that devices made with Baytron-P®/VF2-PSEBVE acid blend have lower voltage and higher efficiency and stress-life than Baytron-P®.

Comparative Example A

This example illustrates device performance of Baytron-P®.

The device using Baytron-P® as a buffer layer was made and tested for device performance in the same manner as described in Example 3. The device data is given in Table 1 and clearly shows that the device made with Baytron-P® has higher voltage and lower efficiency and stress-life than the acid blends from Examples 3 and 4.

TABLE 1

Device voltage and efficiency @1,000 nits and stresslife @ 5,000 nits.

|  | Buffer | | |
| --- | --- | --- | --- |
|  | Example 3 | Example 4 | Comparative Example A (Al4083) |
| PH | 1.9 | 1.7 | 1.7 |
| Lifetime (h) | 180 to 230 | 170 to 200 | 30 |
| Efficiency (cd/A) | 11.0 | 11.0 | 8 |
| Voltage (V) | 3.2 | 3.1 | 3.5 |
| Buffer Thickness (Å) | ~700 | ~700 | ~700 |

Comparative Example B

This example illustrates the high contact angle of films made from a blend of Baytron-P with Nafion®, a non-wettable perfluoro-polymeric sulfonic acid. The Baytron-P/Nafion® blend has a ratio of 1 mole PEDT to 0.2 acid equivalent of Nafion®.

In this comparative example, Baytron-P® Al4083 (solid: 1.48%, pH~1.7; 1:6 w/w ratio between PEDT/PSS) was used to form a blend with DE1021 (11.08% Nafion® polymer in water), a commercial Nafion® from E.I. du Pont de Nemours and Company, Wilmington, Del., USA (hereafter "DuPont Company").

A small drop of the Nafion® was cast on a microscope slide. The film was dried at ~90° C. in a vacuum oven. A small drop of p-xylene was placed on the dried film of the Nafion®. The liquid formed a ball-like droplet and rolled around easily. This illustrates that Nafion® is not organic solvent wettable.

To make the blend of PEDT and Nafion®, 5.22 g DE1021 were dripped in to mix with 194.77 g Baytron-P® in a 250 mL round-bottom flask while being stirred with a magnetic stirrer. The resulting mixture contained 1.73% solid and its pH was 1.8. Its dried (baked at 90° C. for 40 minutes) film conductivity was $3.0 \times 10^{-4}$ S/cm. The dried film was also tested for contact angle by the method described in Example 3. The contact angle was determined to be 51 degrees. This contact angle is very high, indicating that its film surface is difficult to wet with organic solvents such as p-xylene or toluene. These solvents are common ones for dissolving light emitting materials.

Comparative Example C

This example illustrates the high contact angle of a blend of Baytron-P with Nafion®, a non-wettable perfluoro-polymeric sulfonic acid. The Baytron-P/Nafion® blend has a ratio of 1 mole PEDT to 0.8 acid equivalent of Nafion®.

In this comparative example, Baytron-P® Al4083 (solid: 1.48%, pH ~1.7; 1:6 w/w ratio between PEDOT/PSSA) was used to form a blend with DE1021 (11.08% Nafion® polymer in water), a commercial Nafion® from DuPont Company, Wilmington, Del., USA.

19.37 g DE1021 were dripped in to mix with 180.62 Baytron-P® in a 250 mL round-bottom flask while being stirred with a magnetic stirrer. The resulting mixture contained 2.41% solid and its pH was 1.8. Its dried (baked at 90° C. for 40 minutes) film conductivity was $3.0 \times 10^{-4}$ S/cm. The dried film was also tested for contact angle by the method described in Example 3. It was determined to be 53°. This contact angle is very high, indicating that its film surface is difficult to wet with organic solvents such as p-xylene, toluene. These solvents are common ones for dissolving light emitting materials.

Example 5

This example illustrates blending of high % E-PSEPVE sulfonic acid with Baytron-P® Al4083 and effect of pH on device performance.

In this example, Baytron-P® Al4083 (solid: 1.5%, pH~1.7; 1:6 w/w ratio between PEDT/PSS) was used to form a blend with an aqueous solution of 4.08% (w/w) E/PSEPVE sulfonic acid made in Example 2. The percentage of E/PSEPVE sulfonic acid in ratio to Baytron-P® is higher than that in Example 3.

36.21 g of the E-PSEPVE acid solution were dripped in to mix with 103.79 g Baytron-P® in a 250 mL round-bottom flask while being stirred with a magnetic stirrer. The resulting mixture contained 2.17% solid and its pH was 1.7. Its dried (baked at 130° C. in air for 10 minutes) film conductivity was $3.4 \times 10^{-5}$ S/cm. The dried film was also tested for contact angle by the method described in Example 3. It was determined to be 34 degrees. This contact angle is very low, indicating that its film surface is easy to wet with organic solvents such as p-xylene and toluene. These solvents are common ones for dissolving light emitting materials.

70 g of the blend made above were adjusted to pH of 4.0 with a 1 M aqueous NaOH solution. The film was dried (baked at 130° C. in air for 10 minutes) and film conductivity was determined to be $2.1 \times 10^{-5}$ S/cm.

Both low pH and high pH of the blends as a buffer layer were made and tested for device performance in the same manner as described in Example 3. The device data is shown in Table 2 and clearly shows that devices made with pH 4.0 material have higher voltage and lower efficiency.

TABLE 2

Device voltage and efficiency @1,000 nits

|  | Buffer | |
| --- | --- | --- |
| PH | 1.7 | 4.0 |
| Efficiency (cd/A) | 12.5 | 6.0 |
| Voltage (V) | 3.1 | 4.5 |
| Buffer Thickness (Å) | ~700 | ~700 |

Example 6

This example illustrates blending of high % VF2/PSEBVE sulfonic acid with Baytron-P® Al4083 and effect of pH on device performance.

In this example, Baytron-P® Al4083 (solid: 1.5%, pH~1.7; 1:6 w/w ratio between PEDOT/PSSA) was used to form a blend with an aqueous solution of 4.4% (w/w) VF2/PSEBVE sulfonic acid made as in Example 1. The percentage of VF2/PSEBVE sulfonic acid in ratio to Baytron-P is higher than that in Example 4.

30.53 g of the VF2/PSEBVE acid solution were dripped in to mix with 109.47 g Baytron-P® in a 250 mL round-bottom flask while being stirred with a magnetic stirrer. The resulting mixture contained 2.13% solid and its pH was 1.6. The mixture was dried (baked at 130° C. in air for 10 minutes) and film conductivity was determined to be $2.7 \times 10^{-5}$ S/cm. The dried film was also tested for contact angle by the method described in Example 3. It was determined to be 27 degrees. This contact angle is very low, indicating that the film surface is easy to wet with organic solvents such as p-xylene and toluene. These solvents are common ones for dissolving light emitting materials.

70 g of the blend made above were adjusted to pH of 4.0 with a 1 M aqueous NaOH solution. It was dried (baked at 130° C. in air for 10 minutes) and film conductivity was $5.2 \times 10^{-5}$ S/cm.

Both low pH and high pH of the blends as a buffer layer were made and tested for device performance in the same manner as described in Example 3. The device data is shown in Table 3 and clearly shows that devices made with pH 4.0 material have higher voltage requirements and lower efficiency.

TABLE 3

Device voltage and efficiency @1,000 nits

| | Buffer | |
|---|---|---|
| PH | 1.6 | 4.0 |
| Efficiency (cd/A) | 11.8 | 5.0 |
| Voltage (V) | 3.0 | 3.5 |
| Buffer Thickness (Å) | ~700 | ~700 |

Note that not all of the activities described above in the general description or the examples are required, that a portion of a specific activity may not be required, and that one or more further activities may be performed in addition to those described. Still further, the order in which activities are listed are not necessarily the order in which they are or must be performed.

In the foregoing specification, the concepts have been described with reference to specific embodiments. However, one of ordinary skill in the art appreciates that various modifications and changes can be made without departing from the scope of the disclosure as set forth above or in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all of the claims.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. References to values stated in ranges include each and every value within that range.

What is claimed is:

1. A polymer composition comprising at least one doped electrically conductive polythiophene polymer in admixture with at least one organic solvent wettable fluorinated acid polymer wherein said solvent wettable fluorinated acid polymer forms a film which is wettable by phenylhexane with a contact angle no greater than 40°.

2. The composition of claim 1, wherein the polythiophene has Formula I:

(I)

wherein:
$R^1$ is independently selected so as to be the same or different at each occurrence and is selected from the group consisting of hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

3. The composition of claim 1, wherein the polythiophene has Formula I(a):

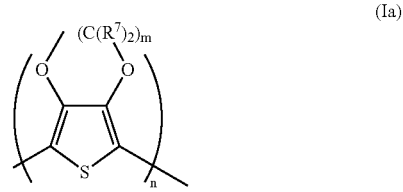

(Ia)

wherein:
$R^7$ is the same or different at each occurrence and is selected from the group consisting of hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, m is 2 or 3, and n is at least about 4.

4. The composition of claim 1, wherein the polymeric fused polycyclic heteroaromatic is derived from a monomer having Formula V:

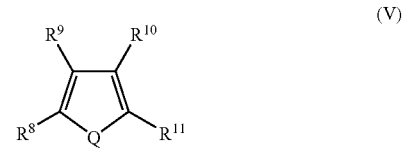

(V)

wherein:

Q is S;

$R^8$, $R^9$, $R^{10}$, and $R^{11}$ are independently selected so as to be the same or different at each occurrence and are selected from the group consisting of hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur or oxygen atoms.

5. The composition of claim 1, wherein the electrically conductive polymer is selected from the group consisting of poly(3,4-ethylenedioxythiophene), poly(thieno(2,3-b)thiophene), poly(thieno(3,2-b)thiophene), and poly(thieno(3,4-b)thiophene).

6. The composition of claim 5, wherein the dopant is a polymeric sulfonic acid.

7. The composition of claim 5, wherein the contact angle is no greater than 35°.

8. The composition of claim 1, wherein the doped electrically conductive polymer comprises a non-fluorinated polymeric acid dopant.

9. The composition of claim 1, wherein the organic-solvent wettable fluorinated acid polymer comprises an acidic group selected from the group consisting of carboxylic acid groups, sulfonic acid groups, sulfonimide groups, phosphoric acid groups, phosphonic acid groups, and combinations thereof.

10. The composition of claim 1, wherein the organic-solvent wettable fluorinated acid polymer comprises a backbone selected from the group consisting of polyolefins, polyacrylates, polymethacrylates, polyimides, polyamides, polyaramids, polyacrylamides, and copolymers thereof.

11. The composition of claim 1, wherein the organic-wettable fluorinated acid polymer comprises fluorinated side chains selected from the group consisting of alkyl groups, alkoxy groups, amido groups, ether groups, and combinations thereof.

12. The composition of claim 1, wherein the organic-solvent wettable fluorinated acid polymer comprises a fluorinated olefin backbone and pendant groups selected from the group consisting of fluorinated ether sulfonate groups and fluorinated ether sulfonimide groups.

13. The composition of claim 1, wherein the organic-solvent wettable fluorinated acid polymer is selected from the group consisting of a copolymer of 1,1-difluoroethylene and 2-(2,2-difluoro-2-(trifluoromethyl)allyloxy)-1,1,2,2-tetrafluoroethanesulfonic acid; a copolymer of ethylene and 2-(2-(1,2,2-trifluorovinyloxy)-1,1,2,3,3,3-hexafluoropropoxy)-1,1,2,2-tetrafluoroethanesulfonic acid; and combinations thereof.

14. The composition of claim 1, wherein the organic-solvent wettable fluorinated acid polymer comprises a fluorinated and partially sulfonated arylene ether sulfone.

15. The composition of claim 1, wherein the organic-solvent wettable fluorinated acid polymer is derived from at least one monomer having a formula selected from Formula VII

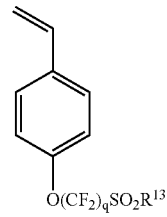

(VII)

where:
q is an integer from 1 to 5,
$R^{13}$ is OH or $NHR^{14}$, and
$R^{14}$ is alkyl, fluoroalkyl, sulfonylalkyl, or sulfonylfluoroalkyl;

and Formula VIII

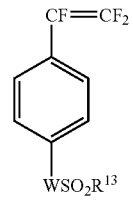

(VIII)

where:
W is selected from the group consisting of $(CF_2)_q$, $O(CF_2)_q$, $S(CF_2)_q$, $(CF_2)_qO(CF_2)_r$,
q and r are independently an integer from 1 to 5,
$R^{13}$ is OH or $NHR^{14}$, and
$R^{14}$ is alkyl, fluoroalkyl, sulfonylalkyl, or sulfonylfluoroalkyl.

16. The composition of claim 1, wherein the organic-solvent wettable fluorinated acid polymer has Formula IX

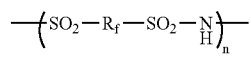

(IX)

where:
$R_f$ is selected from the group consisting of fluorinated alkylene, fluorinated heteroalkylene, fluorinated arylene, and fluorinated heteroarylene; and
n is at least 20.

17. The composition of claim 1, wherein the organic-wettable fluorinated acid polymer comprises a fluorinated polymer backbone and a side chain having Formula X:

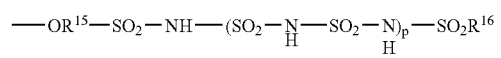

(X)

where:
$R^{15}$ is a fluorinated alkylene group or a fluorinated heteroalkylene group;
$R^{16}$ is a fluorinated alkyl or a fluorinated aryl group; and
p is 0 or an integer from 1 to 4.

18. The composition of claim 1, wherein the organic-solvent wettable fluorinated acid polymer has Formula XI:

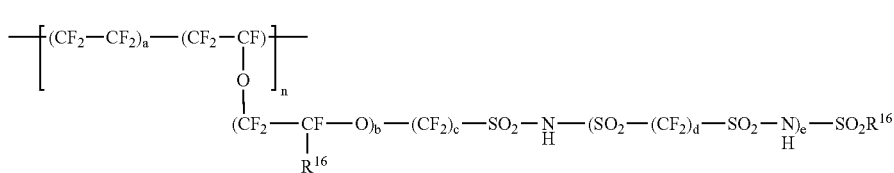
(XI)

where:
$R^{16}$ is a fluorinated alkyl or a fluorinated aryl group;
a, b, c, d, and e are each independently 0 or an integer from 1 to 3; and
n is at least 4.

19. An aqueous dispersion of polymer composition comprising at least one electrically conductive polythiophene polymer blended with at least one organic solvent wettable fluorinated acid polymer, wherein the composition has a pH between 1.5 and 4 wherein said solvent wettable fluorinated acid polymer forms a film which is wettable by phenylhexane with a contact angle no greater than 40°.

20. The dispersion of claim 19, wherein the pH is between 2 and 3.

* * * * *

UNITED STATES PATENT AND TRADEMARK OFFICE
CERTIFICATE OF CORRECTION

PATENT NO. : 7,638,072 B2
APPLICATION NO. : 11/475710
DATED : December 29, 2009
INVENTOR(S) : Hsu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 602 days.

Signed and Sealed this

Ninth Day of November, 2010

David J. Kappos
*Director of the United States Patent and Trademark Office*